United States Patent [19]

Lewiner et al.

[11] Patent Number: 4,553,089
[45] Date of Patent: Nov. 12, 1985

[54] DEVICES DESIGNED TO MEASURE LOCALLY THE ELECTRIC CHARGES CARRIED BY DIELECTRICS

[76] Inventors: Jacques Lewiner, 5, rue Bory d'Arnex, 92210 Saint Cloud; Georges Charpak, 14, rue du Clos, Geneve, both of France

[21] Appl. No.: 476,195

[22] Filed: Mar. 17, 1983

[30] Foreign Application Priority Data

Mar. 17, 1982 [FR] France ................. 82 04545

[51] Int. Cl.[4] ............................................ G01N 27/00
[52] U.S. Cl. .................................. 324/71.1; 324/72; 324/452; 324/457
[58] Field of Search .............. 324/71.1, 452, 455, 324/458, 459, 456, 71.5, 457; 324/468, 469, 470

[56] References Cited

U.S. PATENT DOCUMENTS 4,106,107  8/1978  Goodman .................. 324/457

FOREIGN PATENT DOCUMENTS 2623697  4/1977  Fed. Rep. of Germany ...... 324/452
0601839  4/1978  U.S.S.R. .............................. 324/458

Primary Examiner—Ernest F. Karlsen
Assistant Examiner—Kevin D. O'Shea
Attorney, Agent, or Firm—Larson and Taylor

[57] ABSTRACT

In order to measure the values of the electrical charges (2) carried by a surface S of a dielectric sheet (1), one uses a device consisting of a first electrode or probe (S) facing the surface S, a second electrode (4) applied against the back surface of this sheet, means (F) to displace laterally the probe with respect to the sheet and means (5) to measure the charges (6) induced on this probe.

In addition, by means of acoustical, optical or electrical methods, one subjects the surface S to deformation localized in very small spots p (of an area inferior to the one defining the spatial resolution of the measurement) during very short times and repeatly at frequence high enough and in such a way as to have some overlapping of the spots sequentially deformed.

10 Claims, 6 Drawing Figures

DEVICES DESIGNED TO MEASURE LOCALLY THE ELECTRIC CHARGES CARRIED BY DIELECTRICS

The invention relates to devices designed to measure locally the electric charges carried superficially by a dielectric support in the form of a sheet or a similar structure. Such a support will be referred to as a "sheet" in the following text but it will be understood that the support could as well be of the form of a sheet or of a similar form such as that of a tape a disk or a drum.

It can be advantageously applied to read informations or images recorded electrically on such sheets.

It aims more particularly, among the reading devices of the kind considered here, those consisting of a first electrode facing the side, of the sheet carrying the charges to be measured, this electrode being called "probe" hereafter, a second electrode set against the side of the sheet, opposite to the charged side under study, means to have the sheet displaced relative to the probe, and means to measure at every instant of time the charges induced on the probe by the charges to be measured.

By the word "measurement" we mean in the present text as well a measurement resulting in the display of a value on an appropriate instrument, with or without recording, as the determination of a parameter, exploited immediately, without display, for recording purposes, automatic correction, alarm or any other purpose.

In the measuring devices of this kind, already known, the measurement is often done by having the probe vibrating in the direction of the sheet at a frequency g or by masking periodically from the probe at this frequency g, the surface of the sheet under study, thus modulating with said frequency the value of the charges induced on the probe, thus producing alternating variations of an electrical parameter such as a voltage or a current, associated to the value of the induced charges being modulated, and by measuring this electrical parameter.

These devices, often named "vibrating condenser electrometers" exhibit some advantages but also the following drawbacks :

the electrical parameter exploited for the measurement depends not only on the value of the charges to be measured but also on the mean distance d between the probe and the sheet; in order to make the measurement as insensitive as possible to the quality of the flatness of the sheet or to the changes in thickness or transversal positions of this sheet, it is necessary to reduce as much as possible the relative variations of this distance d, that is to say to increase as much as possible this distance; but if one wants to obtain a measurement of good quality, that is to say a good spatial resolution, it is necessary to use a probe of very small lateral dimensions, which implies, in order to have a sufficient sensitivity to position the probe very close to the sheet and thus to have a small value for the distance d, such positioning of the probe very close to the sheet can be the cause of electrical breakdowns, since the frequency g is connected to mechanical displacements, it cannot be very high, being in general of the order of a few hundred or a few thousand Hertz which limits the relative speed of displacement between the probe and the sheet: indeed the detection of the charge of each of the surface units which one wishes to differentiate the dimensions of which define the spatial resolution of the measurement -requires several cycles of the above mentioned mechanical displacements at the frequency g; the measurement can thus be quite long when it concerns a large area to be scanned with a high spatial resolution, the electrical parameter exploited for the measurement provides a global information on the value of the electrical charges carried by the whole surface of the sheet which can influence the probe; this also introduces a limitation for the spatial resolution which can be obtained.

It is a particular object of the invention to overcome these various drawbacks, that is to say to permit the measurement with a good spatial resolution at the highest speed while having a good insensitivity to electrical breakdowns and to variations of the distance d.

Accordingly the measuring devices of this kind are essentially characterized by the fact that they include means to deform the sheet, for a very short time $t_o$, over a spot p the position of which is related to that of the probe and the surface of which s, very small, is of the order of the required spatial resolution, each deformation being created in such a way that, only spot p is concerned by this deformation, these local deformations being repeated at a frequence $f_o$ large enough, depending on the speed of the relative displacement of the sheet with respect to the probe, so that the different spots p sequentially deformed overlap at least partially.

In preferred embodiments recourse is had in addition to one or other of the following features:

the spot p is centered on the axis of the probe, the means to deform include at least one source of pressure pulses, the means to deform according to the preceding item include a plurality of pressure pulse sources, the pressure pulses emitted by the different sources being concentrated simultaneously on a focal zone located at spot p or a close proximity from that spot, the pressure pulses according to the preceding item are created simultaneously at points located on the same spherical surface the center of which is in the focal zone, the pressure pulses according to the item which precedes the preceding item are created on points situated in the same plane, at different instants of time depending on their positions in this plane, the deforming means comprise at least one source of radiation of sufficient energy to deform mechanically, by brutal heating, a target on which this radiation is sent, the radiation according to the preceding item is light, in a measuring device according to the preceding item, for which the second electode is a thin conductive layer disposed against the face of the sheet opposite to the probe, the radiation is focused on a point of the external surface, of this layer, placed transversally opposite to the spot p to be deformed, in a measuring device according to the preceding item, the conductive layer constituting the second electrode is covered, on its face opposite to the sheet, by a rigid layer transparent to the radiation being considered, the probe is composed of a central electode and of at least one cylindrical electrode surrounding this electrode and being electrically insulated from it, the measuring means of the induced charges on the probe are only activated for very short periods of time corresponding at least to the build-up time of the local deformation of the sheet, the surface s of spot p to be deformed has approximatively the shape of a circle, the diameter of which is in the range 10 to 500 microns, The invention includes, beside these principal features, some other features which are preferably used at the same time and which will be explicitly described thereafter.

In the following, preferred embodiments of the invention will be described with reference to the accompanying drawings given of course purely by way of non-limiting illustration.

FIG. 1 of these drawings, is a schematic diagram used to explain the principle of the invention.

In each case, the purpose is to analyze the distribution of electric charges carried by a dielectric sheet 1.

As said above, this sheet can have the shape of an ordinary sheet or have the shape of any other support (tape, record, drum . . . ) extending essentially over two dimensions with the third dimension extending over a relatively small thickness. This thickness is generally comprised between 10 and 1,000 microns.

The dielectric constituting the sheet is advantageously constituted of an insulating material, like a plastic (polypropylene, polytetrafluoroethylene, polyamid . . . ) or an mineral (glass . . . ) or also a photoconductor (Cadmium sulfide, selenium, polyvinyl carbazol . . . ).

If it is a photoconductive material the sheet can be prealably impressed electrically by illumination through an image constituting a mask, the different constituents of the mask being more or less opaque to light as a function of their darkness in the image.

The measurement of electric charges according to the invention, then made progressively over all the surface of the sheet with an adequate scanning, permits in such a case to record this image on any appropriate support (tape, disk, wire, card . . . ), more particularly as a succession of small magnetized spots with magnetization intensities proportional to the detected charges, in order then to reconstruct the above said image from the recording made at any desirable moment on any appropriate support such as sheet, tape, plate . . . .

The phase of intermediate recording can also be suppressed, the electrical parameters obtained from the measurement of the charges being immediately exploitable in order to reconstruct the image on any desirable support such as a cathode ray tube.

The electric charges 2, the value of which have to be measured, are carried by one of the two faces S of the sheet in the sense that they are localized on this face S or in the vicinity of its, that is to say at a small depth inside the sheet.

Figure 1:
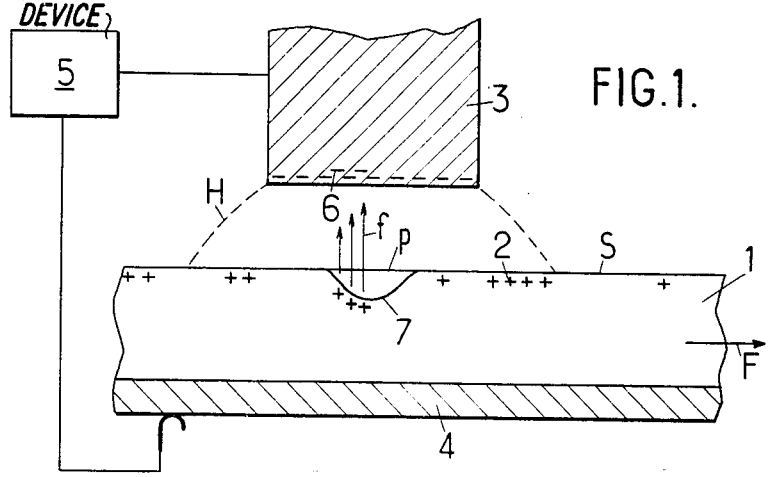

They have been represented by the + signs on FIG. 1, in a purely illustrative manner, said charge densities being stronger where more signs + are represented per unit length on the sheet.

Facing this sheet the free end of a measuring electrode 3, called a "probe" in the following text, appears usually as a cylindrical small piece of small diameter, (for instance 1 to 5 mm).

A second electrode 4 is applied against the face of the sheet 1, opposed to face S.

This second electrode is advantageously made of a thin metallic layer placed against the sheet.

The two electrodes 3 and 4 constitute the two electrodes of a capacitance in which is laying the charged dielectric to be measured. These two electrodes are electrically connected to a measuring device schematized by box 5.

Means symbolized by the arrow F are foreseen in order to displace the sheet 1 laterally with respect to probe 3.

When the charges 2 are brought in front of probe 3 they induce, on it, charges 6 of opposite sign.

The measurement of the charges 2 carried by sheet 1 is equivalent to measuring the induced charges 6.

As said above, the techniques usually proposed for measuring these induced charges rely on mechanical vibrations producing a modulation of these quantities, this modulation producing an alternating variation of a measurable electrical parameter.

Although these techniques are satisfactory in some circumstances, the value of the induced charges 6 considered at each instant of time are related to the charges 2 of all the region, on face S, susceptible to influence electrically, at this instant of time, probe 3.

This region, delimited by contour H of FIG. 1 has a larger extension than the section of the probe : it can thus be very large.

As a consequence, it is not possible with the known techniques to differentiate, when analyzing the charges carried by face S, the sub-regions which are diversely charged inside the considered region.

The spatial resolution is then quite rough.

In order to refine this resolution, according to the invention, no provision is made for a global modulation of the induced charges 6, but one deforms momentary and only locally on face S at a place facing the probe, a spot p, the surface s of which is very small.

The main variations of the charges induced at every instant of time on the probe are then due to the charges carried by the small spot p deformed at this instant of time.

One then has an instrument permitting the analysis of face S from the point of view of the electric charges carried by this face with a very good spatial resolution, this resolution being defined by the diameter of the small deformed spot p.

Said deformation of spot p is symbolically represented on FIG. 1 by crater 7 and the influence of charges 2 localized on spot p thus deformed has been symbolized by arrows f.

The small surface s of spot p is generally delimited outward by a circle with a diameter advantageously chosen of the order of 100 microns, this diameter being generally comprised between 10 and 500 microns.

The local deformation of sheet 1 is limited not only in space but also in time, its duration $t_o$ being dependent on its velocity of propagation in this sheet and at the surface s.

But the measurement of the charges has to be done, without discontinuity, over the whole length of sheet 1 along the direction of the relative displacement F.

To this effect, the said deformation is repeated at a frequency $f_o$ large enough to permit, taking into account the relative displacement speed, some overlapping of the successively deformed spots p of face S.

Frequency $f_o$ is generally comprised between 10 Hz and 1 MHz, the time $t_o$ being itself comprised between 100 ps and 30 ns for displacement speeds between 1 mm/s and 10 m/s.

In order to produce the repeated deformations, very localized and very short in time as above mentioned, all desirable means can be used.

These means can be foreseen such as to produce directly these deformations starting from the portion of space located on the side of face S of sheet 1.

In such a case the deforming means can operate coaxially with respect to probe 3 and on the same side of the sheet as the probe.

Or, also, the operating axis of these means can be tilted with respect to a direction perpendicular to face S, probe 3 being then, eventually, laterally partially bored to leave a passage for this axis, and/or the axis of this probe being itself inclined with respect to this perpendicular direction and converging towards spot p or towards the immediate vicinity of this spot.

In the mode of realization which will be described hereafter in a purely illustrative manner, the deformation means are situated on the side of sheet 1 opposite to surface S to be deformed.

Figure 2:
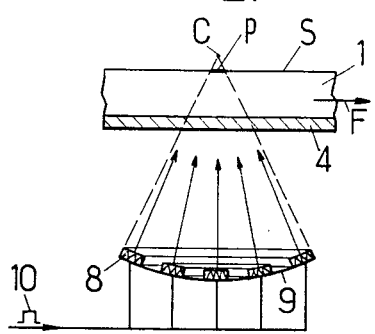
FIGS. 2 to 5 show schematically four modes of realization of this principle.
Figure 3:
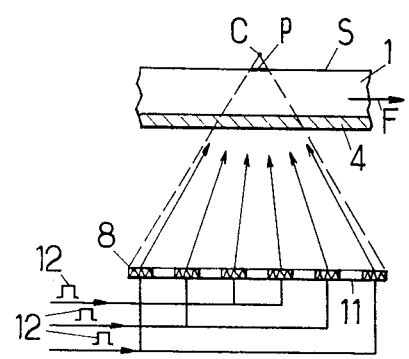

In the modes of realization schematized on FIGS. 2 and 3 the deforming means are of acoustical type and work by focusing acoustical pressure pulses.

In each case, the sources of these pulses are electromechanical transducers 8, notably of piezoelectric type.

In the case of FIG. 2, these transducers 8 are arranged on the same spherical surface S, of center C placed in close vicinity of spot p, for instance slightly externally to sheet 1.

In this case, all the pressure pulses 10 are created simultaneously by the different sources 8 such as to be focused simultaneously on spot p.

In the case of FIG. 3, the transducers 8 are arranged on a same plane 11 parallel to the sheet 1, following concentric and coaxial rings with their common axis perpendicular to the sheet and colinear to that of the probe.

In this case the pressure pulses 12 are created sequentially by the different rings, being delayed with respect to each other in such a way as to arrive simultaneously at spot p.

Figure 4:
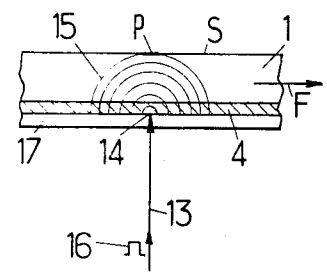
Figure 5:
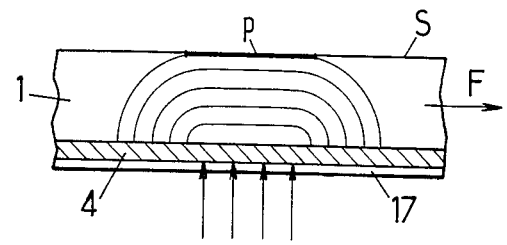
Figure 6:
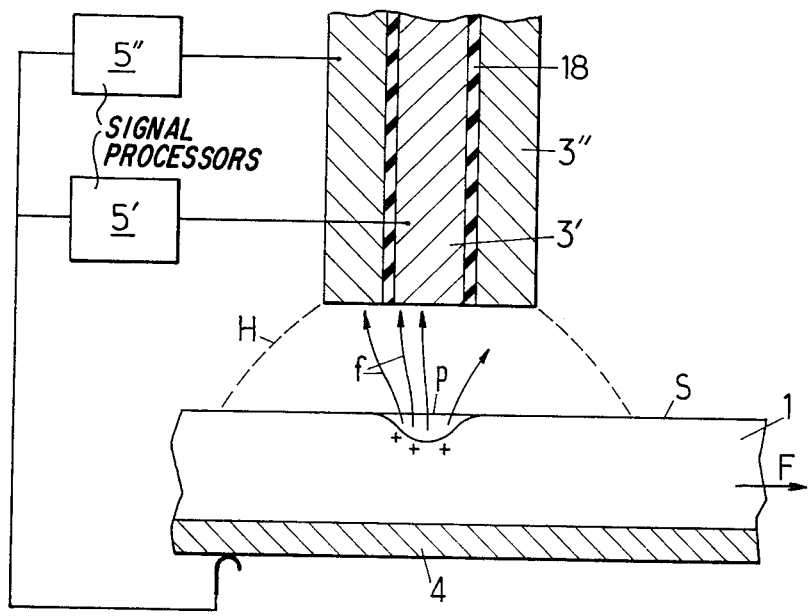
FIG. 6 is similar to FIG. 1 but shows another mode of realization of the probe.

In the case of FIGS. 4 and 5, the deforming means rely on a radiation field of large energy.

This radiation field could be an electron beam.

According to a mode of realization which is particularly advantageous, this radiation field 13 could be a light beam of laser type or emitted by a lamp with a focusing system.

This radiation 13 is here focused on the target as a point 14 (FIG. 4), a line or a plane 14' (FIG. 5) placed exactly facing spot p on the side of the conductive layer 4 which constitutes the second electrode, opposite to sheet 1.

The energy of this radiation beam 3 is sufficient to produce a sudden heating of the target, heating producing an overpressure propagating as spherical waves 15 (FIG. 4) or plane waves 15' (FIG. 5) in the coating 4 and in the dielectric constituting sheet 1.

The duration of the setting of the local deformation of sheet 1, that is to say the rise time $t_1$ of each light pulse 16 which is the cause of radiation 13, must be smaller than the duration of the propagation of the mechanical perturbation through the thickness of said sheet.

In other words, if v is the velocity of this propagation and e the thickness of the sheet, the quantity $vt_1$ must be smaller than e.

The total duration of each pulse 16 may then be of the order of $2t_1$.

As an example, if the thickness e is equal to 100 microns, the duration $t_1$ must be smaller than 30 ns and preferably of the order of 1 ns, since the velocity v has in general a value between 1,100 and 5,000 m/s.

In order to increase the amplitude of the deformation, it may be advantageous to put against the target 14 or 14' a layer 17 transparent at the wavelength of radiation 13, which has the effect of confining on the side of sheet 1 the mechanical wave induced by the sudden heating of the target.

It may also be advantageous to coat electrode 4 with a substance, such as graphite, which strongly absorbs the radiation used in order to optimize the transformation into heat of the incident light energy.

The thickness of this layer 4 is advantageously comprised between 500 A and 500 microns.

The lower values of the above range of thicknesses can be used when the processes applied to sheet 1 which lead to the measurement, require the use of a relatively small energy pulse, or of a small number of such pulses, in each of the regions acting as the targets 14 or 14': each of these pulses may, indeed, take off the target, by vaporization, a small volume of material on a depth which may be comprised between 500 A and 1 micron.

For the lowest values of the above range of thicknesses, layer 14 may be obtained by vacuum deposition whereas an electrolytic or electrochemical deposition will be more suited for intermediate thicknesses and, preferably for larger thicknesses this layer will be made by application against the sheet of an independent layer of material.

In order to reduce the above described effect, one can spray, on layer 4, an intermediate material, such as colloidal graphite, for instance before each measuring cycle of sheet 1.

The measuring means 5 may advantageously be arranged in such a way as to only make a measurement during very short times which include the instants of time when the local deformation of sheet 1 are produced, for instance those when the mechanical perturbations produced by the sudden heating of layer 4 reach said sheet 1.

For instance, if layer 4 has a thickness of the order of 100 microns and is made with a material in which the velocity of propagation of mechanical waves is of 5,000 m/s, sheet 1 is reached 20 ns after the time at which the light pulse 16 has reached layer 4: it is then advantageous to open the measuring means 5 only 20 ns after the emission of pulse 16, and that for a duration of the order of $t_o$ or of the above described time $t_1$.

This makes it possible to greatly enhance the signal to noise ratio during the measurement.

Instead of being made of an single conducting piece 3, the probe may be made of a central conducting piece 3' and of a cylindrical conducting piece 3" in which is placed piece 3', these two pieces 3' and 3" being separated by an electrically insulating piece 18, each of these pieces being connected to signal processing units 5', 5": with such a system, it is possible to measure simultaneously the variations of charges induced respectively on pieces 3' and 3" by the local deformations of sheet 1 and to obtain in such a way an information on the distance d between the probe and the sheet, information which can be used in the processing of the signal in order to compensate eventual fluctuations of this distance d. The external piece 3" can also be used as a shield or as a guard ring or be itself surrounded by another cylindrical conducting piece having this function.

As is obvious and as results already from what has been written above, the invention is in no way limited to its modes of application and of realization which have been particularly considered; it embraces on the contrary all the variations, notably:

those where it is not sheet 1 which is displaced relative to the probe 3 and the deforming means, but the probe and the deforming means, or at least the active part of these means which would be displaced relative to the sheet in a direction parallel to it, those in which the small local deformations of sheet 1 would be located not near its face S or in the immediate vicinity of this face, as in the above described examples, but in the bulk of sheet 1, or even in the vicinity of layer 4, the local deformation being such that the change in the charges induced on the probe result from the charges carried by the sheet, in the region facing the deformed region, those in which local deformations of the sheet according to the invention are produced simultaneously on various points of the sheet, each of these points being associated with a probe and measuring means, the distance between the points being large enough so that the local deformation produced at one point does not modify significantly the charges induced on other probes than the one facing said point, those according to the preceding variation in which the local deformations are produced by the impact at the same time on layer 4 of various focused light beams, those various beams originating from a main beam having been splitted, those according to the variation preceding the preceding one in which the probes have the form of strips parallel to the sheet, those strips being made of thin metallic wires or of conductive regions supported by an insulating plate, for instance a printed circuit board.

We claim:

1. A measuring device for measuring locally the electric charges carried superficially by a dielectric sheet, said device comprising a first electrode, facing the surface of the sheet carrying the electric charges to be measured and constituting a probe, a second electrode placed against the side of the sheet opposite to the surface of said sheet carrying the electric charges, means for providing a relative displacement of the probe along the sheet, means for measuring at each instant of time the charges induced on the probe by the charges to be measured, and means for deforming the sheet, during very short time periods, at a spot p the size of which is very small relative to that of the probe and the surface, and is on the order of the required spatial resolution and which is fixed in position relative to the probe and the surface in directions parallel to the surface, the sheet being deformed in a way such that only the spot p is concerned with this deformation, and the sheet being repeatedly deformed at a frequency $f_o$ large enough, in relationship to the speed of the relative displacement of the sheet with respect to the probe, that sequential deformations of different spots p overlap at least partially.

2. Measuring device according to claim 1, wherein each spot p is centered on the axis of the probe.

3. Measuring device according to claim 1 wherein the deforming means include at least one source of pressure pulses.

4. Measuring device according to claim 3, wherein the deforming means include a plurality of pressure pulse sources, the pressure pulses emitted by these different sources being concentrated simultaneously on a focal zone located at a spot p or in close proximity to the spot.

5. Measuring device according to claim 1, wherein the deforming means includes at least one radiation source of sufficient energy to deform mechanically a target to which the radiation therefrom is transmitted.

6. Measuring device according to claim 5, wherein the radiation is light.

7. Measuring device according to claim 6 wherein the second electrode is a thin conductive layer disposed against the face of sheet opposite to the probe, and the radiation is focused on a point on the external surface of this thin layer located opposite to the spot p.

8. Measuring device according to claim 7 wherein the conductive layer constituting the second electrode is covered, on its face opposite to the sheet, by a rigid layer transparent to the radiation.

9. Measuring device according to claim 1 further comprising means for activating the measuring means only during very short periods of time corresponding to the time periods during which the sheet is being locally deformed.

10. Measuring device according to claim 1 wherein the shape of the spot p at the surface of the sheet is approximately that of a circle, the diameter of which circle is in the range of 10 to 500 microns.

* * * * *